United States Patent [19]

Chandra et al.

[11] 4,139,904
[45] Feb. 13, 1979

[54] BUBBLE LATTICE FILES WITH SELECTED ACCESS CHANNEL POSITIONING

[75] Inventors: Ashok K. Chandra, Yorktown Heights; Chak-K. Wong, Briarcliff Manor, both of N.Y.

[73] Assignee: International Business Machines Corporation, Armonk, N.Y.

[21] Appl. No.: 811,752

[22] Filed: Jun. 30, 1977

[51] Int. Cl.² ............................................. G11C 19/08
[52] U.S. Cl. ..................................................... 365/3
[58] Field of Search ............................................ 365/3

[56] References Cited
U.S. PATENT DOCUMENTS 4,052,711  10/1977  Lin et al. ..................................... 365/3

Primary Examiner—James W. Moffitt
Attorney, Agent, or Firm—Pollock, Vande Sande & Priddy

[57] ABSTRACT

A bubble lattice file has plural access channels, each access channel providing access to a bubble column aligned therewith for reading and/or writing in the aligned column. At least some of the access channels are spaced from a common reference by distances which for adjacent channels have substantially constant ratio, i.e., at least some adjacent access channels are spaced in a substantially geometric progression.

11 Claims, 5 Drawing Figures

FIG 1
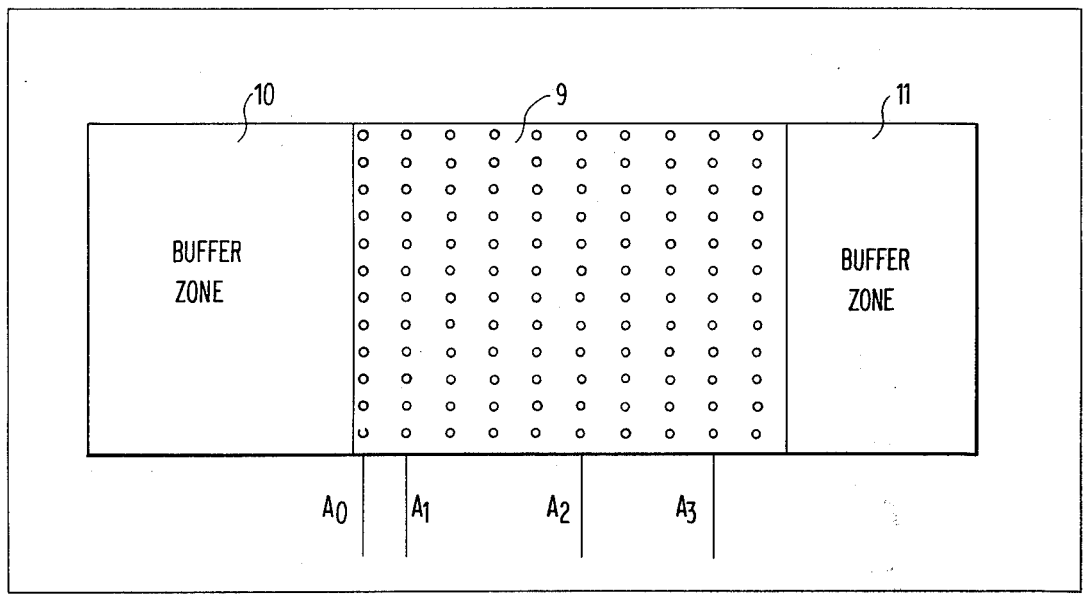
FIG 3A
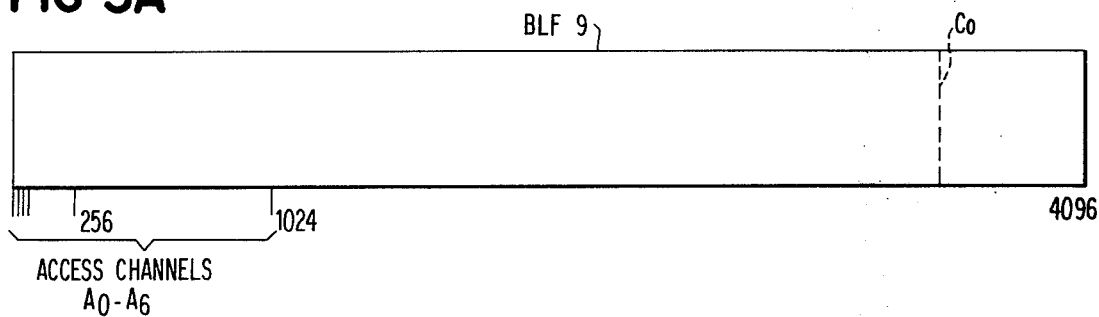
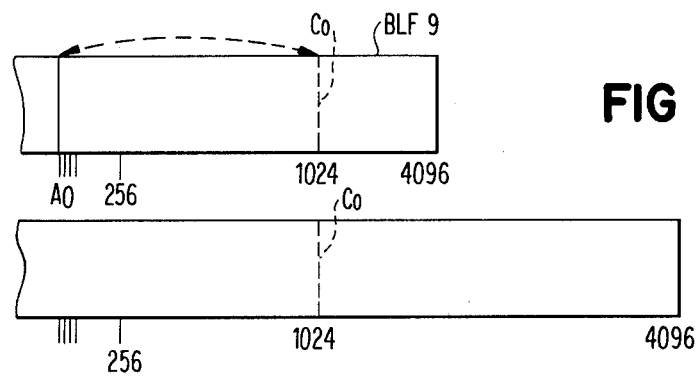
FIG 3B
FIG 3C

BUBBLE LATTICE FILES WITH SELECTED ACCESS CHANNEL POSITIONING

FIELD OF THE INVENTION

The present invention relates to bubble lattice files.

BACKGROUND OF THE INVENTION

The ability to create, support and manipulate single walled magnetic domains in selected materials under proper operating conditions has led to the utilization of devices having the afore-mentioned ability for performing storage and retrieval functions akin to that encountered in computers and related apparatus. A particular class of devices for performing a memory function employing single walled domains (more popularly termed bubbles, as they will be termed hereinafter) is the so-called bubble lattice file.

Bubble lattice files and apparatus particularly useful therewith are disclosed in Voegeli, U.S. Pat. No. 3,930,244; Hu et al, U.S. Pat. No. 3,953,842; and Rosier, U.S. Pat. No. 3,913,079, all assigned to the assignee of this application, and in an article entitled "Data Organization in Magnetic Bubble Lattice Files" by C. K. Wong and P. C. Yue, appearing in Volume 20, Number 6 of the *IBM Journal of Research and Development* (November 1976), pages 576–581.

A bubble lattice file (hereinafter BLF) operates very differently from the more familiar bubble devices in which streams of bubbles propagate synchronously with a reorienting magnetic field. More particularly, in BLF's, bit information is encoded in the wall states of magnetic bubble domains, rather than in the absence or presence of bubbles at certain locations. Bit information is decoded by detecting the direction of movement of bubbles at a sensor under a deflecting field gradient.

A BLF thus includes a lattice or matrix of bubbles in which every position in the lattice is filled. This imparts stability to the BLF since the bubbles interact and tend to support their neighbors.

As disclosed in U.S. Pat. No. 3,930,244, a stable BLF supported on a suitable material is provided with one or more devices for accessing the bubbles contained in the lattice as well as propagation means so that the lattice can be translated with respect to the accessing devices. By their nature, each accessing device or channel is capable of accessing, that is, reading out or writing into any one or all bubble domain positions in the lattice aligned with the channel. Thus, for example, if we consider a bubble lattice to be arranged with rows and columns, the access devices may be, for example, aligned with selected columns of the lattice. Under those circumstances, any one or all of the bubble domains in the columns aligned with the accessing devices can be accessed, that is, the bubbles can be read out or rewritten in accordance with externally applied information. Substantially similar results are obtained if the access channels align with rows instead of columns, and rows and columns need not be perpendicular. As further disclosed in the patent, access is enabled with regard to bubbles not in the columns aligned with the accessing devices by translating the lattice, as a whole, to align a column including the desired bubble or bubbles with one of the accessing devices or channels. One arrangement for translating a bubble lattice for accessing purposes is disclosed in an article entitled "Bubble Lattice Translation - Analysis" by John S. Eggenberger, appearing in the *Proceedings of the Twentieth Annual Conference on Magnetism and Magnetic Materials* (Dec. 3–6, 1974 pages 622–623).

As presently contemplated, a significant function to be performed by a BLF is a sorting function in which an initial form of the lattice will be transformed by rearranging the order in which bubble columns appear. Such a rearrangement can be effected simply by an iterative process of exchanging bubble columns by, for example, coupling a pair of access channels. In this regard, the Wong et al article entitled "Data Organization in Magnetic Bubble Lattice Files" appearing in the *IBM Journal of Research and Development*, Volume 20, Number 6, November 1976, pages 576–581, teaches how adjacent columns can be interchanged. Those of ordinary skill in the art will readily understand, however, that non-adjacent columns can be interchanged by suitably controlling selected switches connecting column accessing devices so long as each is simultaneously adjacent or aligned with an appropriate access channel. It should readily be apparent that multiplying the number of access channels will speed the sorting process by reducing the number of times the BLF has to be translated to align desired columns with an access channel. For example, at one extreme, employing an access channel for each column in the BLF eliminates the necessity for any translation of the BLF. In most applications, however, providing an access channel for each column in the BLF will not be practical.

Thus, for most application, the number of access channels that can be provided will be some number less than the total number of columns in the BLF. Generally, the number of access channels will be vastly smaller than the number of columns in the BLF. The problem to which this invention is directed, then, is how are the access channels to be arranged in the BLF so as to provide for small operating times of the BLF.

It is therefore an object of the invention to provide a method of organizing a bubble lattice file which includes a plurality of access channels, less than the number of columns in the BLF. It is a further object of the invention to provide a BLF in which at least some access channels are arranged so as to facilitate rapid sorting of BLF columns.

Plural access channels are provided, each of which can read or write into an aligned column so that any aligned column can be exchanged with any other aligned column. However, we have found that this capability is unnecessary, at least for sorting operations. Effective and efficient sorting only requires the capacity to interchange an aligned column with the column aligned with the access channel in the reference position.

SUMMARY OF THE INVENTION

The present invention provides a BLF which meets the foregoing and other objects of the invention by arranging a plurality of access channels adjacent a BLF so that the ratio of distances between adjacent channels and a reference point is constant. In a preferred embodiment of the invention, adjacent access channels are spaced in a geometric arrangement. Furthermore, access channels are interconnected so that any selected aligned column can be interchanged with a column aligned with an access channel at the reference point.

BRIEF DESCRIPTION OF THE DRAWINGS

Preferred embodiments of the invention will be disclosed below with reference to the attached drawings in which like reference characters identify identical apparatus, and in which:

FIG. 1 is a plan view of a BLF associated with plural access channels,

FIGS. 3A, 3B and 3C illustrate how a selected column $C_0$ is moved by selective interchange of aligned columns.

DETAILED DESCRIPTION OF A PREFERRED EMBODIMENT

Figure 2:
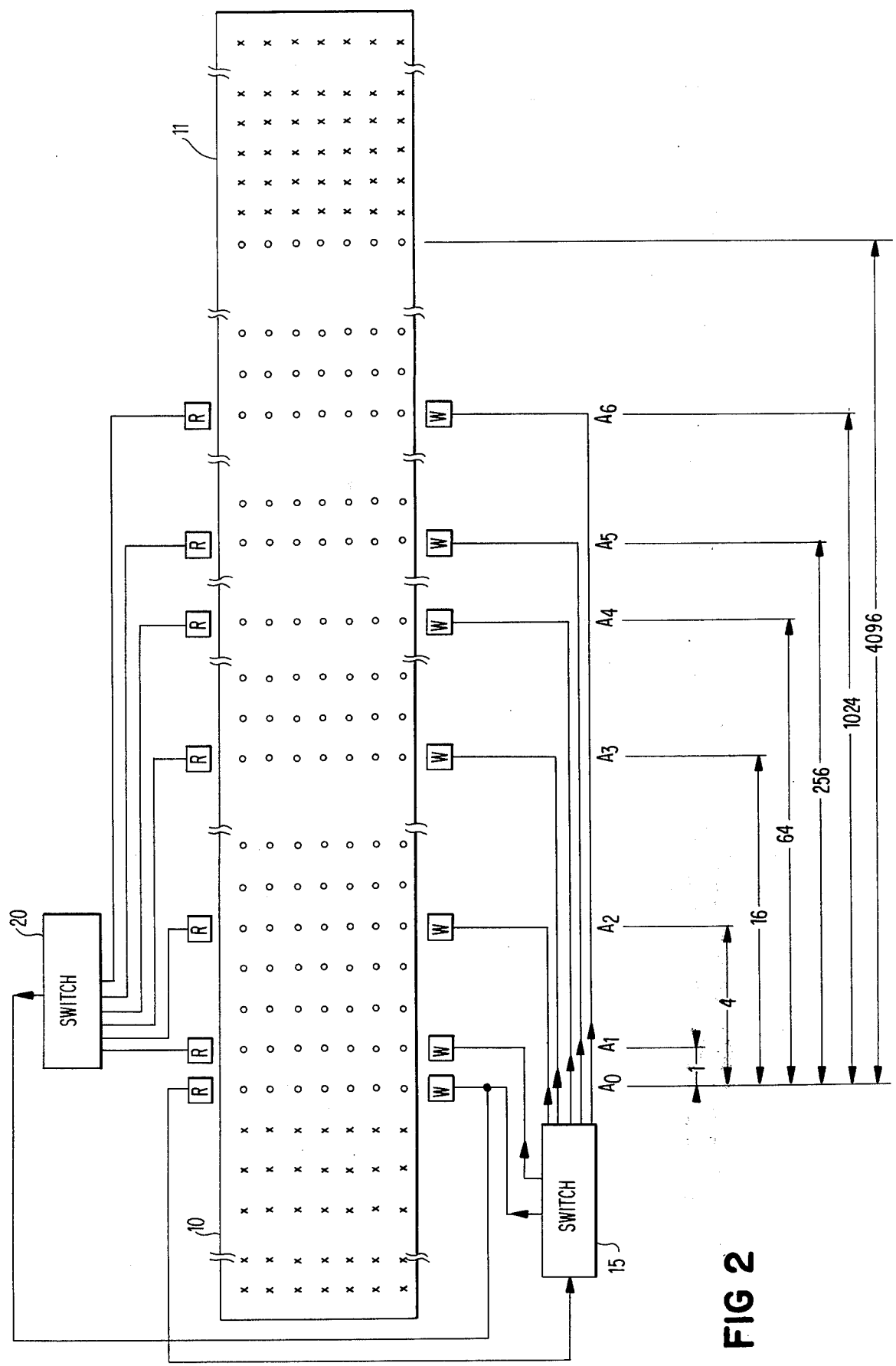
FIG. 2 is a plan view of a BLF comprising a preferred embodiment of the invention specifically illustrating distances between access channels and interconnections of access channels.

As disclosed in the referenced articles and patents, a BLF comprises a suitable area on a selected material capable of supporting single walled magnetic domains or bubbles in an environment capable of supporting a BLF. The BLF is arranged, as shown in the plan view of FIG. 1 to include within the area within which the BLF may exist, the BLF 9 itself as well as, in general, buffer zones 10 and 11 on either side thereof, so that the BLF may be shifted laterally to the right or the left. Access channels are provided adjacent the BLF so that different columns in the BLF can be aligned with different ones of the access channels by laterally shifting the BLF by means, not illustrated. As shown in FIG. 1, four access channels $A_0$, $A_1$, $A_2$ and $A_3$ are provided. In general, any number of access channels can be provided although the number of access channels will usually be much smaller than the number of columns in the BLF. For purposes of describing the invention, distances will be expressed in terms of the column-column spacing of the BLF. FIG. 2 is a plan view of a preferred embodiment. Each of the access channels includes a reading device, identified by the reference character R and a writing device identified by the reference character W. Such reading and writing devices are disclosed, for example, in U.S. Pat. No. 3,913,079. In order to reorder, or sort, the columns of the BLF, means are provided to interchange the locations of two columns. Such means are disclosed, in FIG. 2, as including the reading and writing devices of the various access channels as well as the switches 15 and 20, and the wiring interconnecting them. Thus, for example, the column aligned with access channel $A_0$ can be read and the information in the form of electrical signals is coupled, through the reading device R, to the switch 15 from whence it is available to be rewritten into any of the available access channels. Such rewriting converts the information back into the wall state sense of bubbles in the column. Of course, for sorting purposes, it would not normally be rewritten into the position corresponding to access channel $A_0$, but rather would be rewritten into the BLF by one of the other access channels. Likewise, the column which is to be interchanged with the column aligned with access channel $A_0$ is selected by the switch 20 enabling data presented by the selected read device R of the selected column to pass to the writing device W associated with access channel $A_0$. From the foregoing it should be apparent that any of the columns aligned with access channels can be interchanged with the column aligned with access channel $A_0$.

Providing the BLF with an access channel for each column enables the sorting function to be readily carried out. Under these circumstances, the sorting function is reduced to properly controlling switches 15 and 20 at the appropriate times. However, it was pointed out that providing such a number of access channels is, in general, impractical, and therefore the goal of the invention is to arrange a BLF with a number of access channels significantly less than the total number of columns of the BLF.

The sorting function proceeds by locating the column desired to be the first BLF column ($C_0$) adjacent an access channel. This merely requires tranlating the BLF. This column is then interchanged with the column aligned with access channel $A_0$. If the spread between the access channel $A_0$ and the last access channel is less than the total number of columns this one move will, in general, not locate the $C_0$ in the desired position. More particularly, assume $C_0$ is 2,000 columns from the first column in the file and assume $A_n$, the last access channel, is 1,500 columns from $A_0$, the reference access channel. Under these circumstances, $C_0$ can be moved, at most the equivalent of 1,500 columns so it will still be 500 columns from the desired location, after the first move. Therefore, the process is repeated until $C_0$ is the first column. The next desired column $C_1$ is then located and the process is repeated. At the conclusion of the process the columns of the BLF are in the desired order $C_0, C_1, C_2 \ldots C_{q-1}$, where there are $q$ columns in the BLF.

In accordance with one preferred embodiment of the invention, the access channel $A_1$ is located directly adjacent the access channel $A_0$ such that two adjacent columns may be interchanged by aligning them respectively with the access channels $A_0$ and $A_1$. In general, the access channels are spaced in a geometric progression wherein, if $q$ is the number of columns in the BLF, and $k + 1$ access channels are to be located, then the access channels $A_1, A_2, A_3 \ldots$, and $A_k$ are placed the distances of $q^0$, $q^{1/k}$, $q^{2/k}$, ... and $q^{(k-1)/k}$, from $A_0$.

For example, assume that the BLF has 4,096 columns and six access channels are to be provided. The first access channel $A_0$, is located in a reference position and the next five access channels are spaced distances of 1, 4, 16, 64, 256 and 1,024 bubble columns from the access channel $A_0$, as shown in FIG. 2. This spacing is in the form of a geometric progression and, accordingly, the ratios of the distances between adjacent channels and the reference location is constant. That is, for example, the ratio of 16/4 = the ratio of 64/16 or 256/64 or 1024/256.

An example will suffice to illustrate the advantage of the invention as compared with, for example, equally spaced access channels where the ratio of distances from the reference point to adjacent access channels is not a constant, but in fact, decreases.

To perform a sorting function, an iterative process is followed which includes two different operations; first, the BLF is translated to align an appropriate column with an access channel, and second, two columns are interchanged by means of the access channels. Since the time taken for interchanging two different columns is much longer than the time taken to translate the BLF, the time taken to perform the BLF translation will be neglected in determining the effectiveness of the arrangement for sorting purposes. Furthermore, it will be appreciated that to properly position one column normally several different operations of both shifting and interchanging are required; since we are to ignore the time taken for translating the BLF, our estimate for the effectiveness of the BLF is based upon the number of interchanges or moves required. A move is defined as a single interchange of two columns. Thus, for example, to get an estimate of the effectiveness of the inventive arrangement as compared with an example in which access channels are equally spaced, we can merely estimate the time taken to interchange a randomly selected column with a reference location. For example, assume a BLF with 4,096 columns in which six access channels are provided. In accordance with the invention, the access channels are located as specified above. On the other hand, if the access channels are equally spaced, then they would be spaced approximately 683 columns apart. Assume further that we wish to interchange bubble column 3596, i.e., a column located 3596 columns from the first column, with a reference column or the column in the initial position of the BLF. In accordance with the inventive arrangement, eight moves are required. The first three moves employ the maximum interchange length, 1024 columns (between access channels $A_6$ and $A_0$) and would leave us with the desired column in position 524, i.e., 3596 − 3 (1024). These moves are illustrated in FIGS. 3A, 3B and 3C. FIG. 3A shows, schematically, BLF 9, access channels $A_0$-$A_6$, as well as the desired column $C_0$, in column 3596. To alter the position of this column, the BLF 9 is translated as shown in FIG. 3B, where $C_0$, still in the same relative position, is aligned with $A_6$. After interchanging $C_0$ with the column aligned with $A_0$, the BLF is again translated so $C_0$ is aligned with $A_6$. This process is repeated until $C_0$ is located in the BLF 524 columns from the desired position. The next two moves would be made with access channel $A_5$ moving 256 columns at a time and would leave the desired column in location 12, i.e., 524−2 (256). Finally, three moves with access channel $A_2$ would bring the column of interest in the desired position at column zero, 12−3 (4).

On the other hand, with access channels spaced 683 columns apart, five moves would bring the desired column 181 columns from the desired position, i.e., 3596−5 (683). However, there is no way for moving the desired 181 columns and thus, this arrangement is totally unsatisfactory. As an alternative, we could consider having two adjacent access channels, with the remainder being equally spaced. This would result in all access channels but the first two being spaced 819 columns apart. Starting with the same desired column in location 3596, four moves would bring that desired column to location 20, i.e., 3596−4 (819) and then 20 further moves would bring the selected column to the desired position, i.e., 20−20 (1), for a total of 24 moves, or 3 times the moves required with the inventive arrangement.

From the foregoing, it should be apparent that the inventive arrangement has substantial advantages over equally spaced access channels. At the same time, however, it should be apparent that changes can be made from a strict geometrical progression. For example, if instead of the spacing, 1, 4, 16, 64, 256 and 1024, the access channels were spaced 1, 3, 15, 63, 255 and 1023, substantially all advantages of the invention would be obtained. Furthermore, in terms of ratios of distances between at least some of the adjacent channels and the reference location, this modified arrangement is very close to the previously disclosed embodiment. More particularly, the ratios 1023/255, 255/63 and 63/15 are all substantially equal to four, as were the previously disclosed ratios. While the ratio of four is not essential to the invention (actually it is a function of the total number of columns in the BLF and the desired number of access channels) the use of a substantially constant ratio is.

What is claimed is:

1. A plural access channel bubble lattice file including at least three access channels and plural rows and columns of bubbles, each said access channel providing access to bubble columns aligned therewith for reading and/or writing, at least some of said access channels located, relative to a reference location to establish a substantially constant ratio between distances from said reference location and adjacent channels.

2. The device of claim 1 wherein at least some of said access channels are spaced from a reference location by integral powers of $q^{1/k}$ wherein $q$ = the total number columns in said file and $k + 1$ equals the number of access channels.

3. The device of claim 1 wherein all of said access channels are so spaced and in which said constant ratio equals $q^{1/k}$, wherein $q$ equals the total number of columns in said file and $k + 1$ equals the number of so spaced access channels.

4. The device of claim 1 wherein at least two access channels are spaced to align with adjacent bubble columns of said bubble lattice.

5. The device of claim 1 in which a single access channel is coupled to means for reading out of each other access channel.

6. The device of claim 5 in which said single access channel is coupled to switching means selectively connecting said access channel to any other access channel.

7. The device of claim 1 wherein a single access channel can write into any other of said access channels.

8. The device of claim 7 in which said single access channel is coupled to switching means selectively connecting said access channel to any other access channel.

9. A bubble lattice file with plural rows and columns of bubbles,
at least three access channels, the distance between first and second access channels unequal to the distance betwwen first and third access channels, each said access channel including reading and writing means for, respectively, reading data encoded in bubbles in a column aligned with said access channel and writing data in the form of bubbles in a column aligned with said access channel,
switching means coupling reading means of a first access channel to writing means of others of said access channels and coupling reading means of a plurality of said access channels only to writing means of said first access channel,
whereby contents of any column of said bubble lattice file aligned with one of said access channels other than said first access channel can be interchanged with a column of said bubble lattice file aligned with said first access channel.

10. The device of claim 9 in which at least some of said unequally spaced access channels are spaced substantially in a geometric progression.

11. The device of claim 9 in which said unequally spaced access channels include $k + 1$ channels, said bubble lattice file includes $q$ columns and any of said access channels are located $q^{n/k}$ columns from said first access channel wherein $0 < n < k-1$.

* * * * *

UNITED STATES PATENT AND TRADEMARK OFFICE
CERTIFICATE OF CORRECTION

PATENT NO. : 4,139,904
DATED : February 13, 1979
INVENTOR(S) : Chandra et al

It is certified that error appears in the above-identified patent and that said Letters Patent are hereby corrected as shown below:

In column 2, line 29, change "application" to --applications--.

In column 6, line 42, correct the spelling of "between".

Signed and Sealed this

Eleventh Day of March 1980

[SEAL]

Attest:

SIDNEY A. DIAMOND

Attesting Officer      Commissioner of Patents and Trademarks